United States Patent [19]

Ikeguchi et al.

[11] Patent Number: 4,552,690

[45] Date of Patent: Nov. 12, 1985

[54] ELECTRICALLY CONDUCTIVE RESIN COMPOSITION

[75] Inventors: Nobuyuki Ikeguchi, Ibaraki; Yasunari Osaki, Tokyo; Yoshiyuki Furuya, Kanagawa, all of Japan

[73] Assignee: Mitsubishi Gas Chemical Company, Inc., Tokyo, Japan

[21] Appl. No.: 622,398

[22] Filed: Jun. 20, 1984

[30] Foreign Application Priority Data

Jun. 23, 1983 [JP] Japan ................. 58-113489

[51] Int. Cl.⁴ ................................ H01B 1/06
[52] U.S. Cl. .................... 252/512; 252/514; 252/518; 252/519; 252/511; 252/510; 252/500
[58] Field of Search ............ 252/512, 514, 518, 519, 252/500, 511, 510; 106/20, 1.12, 105; 528/120; 524/378, 382, 401, 435

[56] References Cited

U.S. PATENT DOCUMENTS

| | | | |
|---|---|---|---|
| 4,323,483 | 4/1982 | Rellick | 252/512 |
| 4,356,366 | 10/1982 | Harper et al. | 252/512 |
| 4,456,549 | 6/1984 | Kano et al. | 252/518 |

FOREIGN PATENT DOCUMENTS

| | | |
|---|---|---|
| 103260 | 8/1981 | Japan . |
| 128504 | 10/1981 | Japan . |
| 163165 | 12/1981 | Japan . |
| 163166 | 12/1981 | Japan . |

*Primary Examiner*—Josephine L. Barr
*Attorney, Agent, or Firm*—Browdy and Neimark

[57] ABSTRACT

An electrically conductive resin composition comprising 15–35 parts by weight of a cyanate ester compound and 65–85 parts by weight of an electrically conductive powder selected from the group consisting of a copper powder, a copper alloy powder and a silver powder and mixtures thereof, the cyanate ester component content in the cyanate ester compound being more than 50% by weight in terms of monomer, characterized in that the composition contains 0.5–15 parts by weight of acetylacetone or its derivatives is disclosed. The electrically conductive resin composition is useful as a conductive ink.

8 Claims, No Drawings

ELECTRICALLY CONDUCTIVE RESIN COMPOSITION

BACKGROUND OF THE INVENTION

This invention relates to an electrically conductive resin composition capable of being baked at low temperature and having excellent heat resistance, moisture resistance and adhesion properties.

Known resin compositions capable of being baked at low temperature have been prepared by blending electrically conductive powder, such as carbon powder, copper powder or silver powder with a thermosetting resin, such as acrylic resin, alkyd resin, phenol resin, epoxy resin, polyimide resin and the like.

The present inventors have proposed an electrically conductive resin composition comprising a cyanate ester compound and a conductive powder, such as copper powder, copper alloy powder or silver powder (Refer to Japanese Patent Publication (kokai) No. 128504/1981). However, when electrically conductive resin compositions containing copper powder are heated, the copper powder is likely to be oxidized. So, resin compositions comprising a cyanate ester compound and copper powder were insufficient for use as a resin composition capable of being baked, due to oxidation of copper.

Processes for preventing deterioration in resin compositions through oxidation of copper by adding to the resin composition a reducing agent, such as formic acid, oxalic acid, adipic acid, benzoic acid, anthacene, anthranilic acid or anthrazine have been proposed (Refer to Japanese Patent Publication (kokai) Nos. 103260/1981; 163165/1981 and 163166/1981). However, it was found that when cyanate ester compound was used as resin component, deterioration in the resin composition and lowering of its electrical conductivity and its can-stability by heating it could not be prevented by adding such reducing agent to the resin composition.

SUMMARY OF THE INVENTION

An object of this invention is to provide an electrically conductive resin composition comprising a cyanate ester compound and copper powder, copper alloy powder or silver powder which does not have such shortcomings.

This invention relates to an electrically conductive resin composition comprising 15–35 parts by weight of a cyanate ester compound and 65–85 parts by weight of an electrically conductive powder selected from the group consisting of a copper powder, a copper alloy powder and a silver powder and mixtures thereof, the cyanate ester component content in the cyanate ester compound being more than 50% by weight in terms of monomer, characterized in that the composition contains 0.5–15 parts by weight of acetylacetone or its derivative.

DETAILED EXPLANATION OF THE INVENTION

Examples of the electrically conductive powder include copper, copper alloy powder, such as Cu-Zn alloy powder and silver powder. The conductive powder may contain another conductive powder, such as gold powder, nickel powder, iron powder, iron alloy powder, zinc powder, lead powder or mixture thereof, the metal-coated insulating powder, or carbon black. The conductive powder may be in the form of spheres, ellipsoids, bars, plates, or scales.

It is critical that the cyanate ester compound contains more than 50% by weight of cyanate ester component in terms of cyanate ester monomer. Examples of the preferable cyanate ester compounds include cyanate ester-epoxy composition as disclosed in U.S. Pat. Nos. 3,562,214 and 4,142,034 which are incorporated herein by reference, and cyanate-maleimide resin and cyanater ester-maleimide-epoxy resin as disclosed in U.S. Pat. No. 4,110,364 which is incorporated herein by reference. The cyanate ester compound may contain other thermosetting or thermoplastic resin compounds.

By "cyanate ester component" is meant a compound having at least two cyanate groups in its molecule. The polyfunctional cyanate ester is represented by the formula

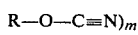

wherein R is an aromatic organic groups, preferably a nucleus-containing residue having 1–10 benzene rings selected from the group consisting of a residue derived from an aromatic hydrocarbon selected from the group consisting of benzene, biphenyl and naphthalene, a residue derived from a compound in which at least two benzene rings are bonded to each other by a bridging member selected from the group consisting of

wherein $R^2$ and $R^3$ are the same or different and each represents a hydrogen atom or an alkyl group containing 1 to 4 carbon atoms,

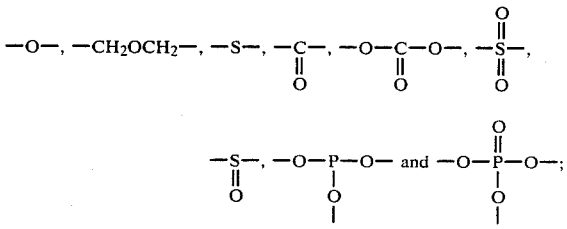

said aromatic nucleus is optionally substituted by a substituent selected from the group consisting of alkyl groups containing 1 to 4 carbon atoms, alkoxy groups, containing 1 to 4 carbon atoms, chlorine and bromine; m is an integer of at least 2 and preferably 2–10, and the cyanate group is always directly bonded to the aromatic nucleus.

Examples of the polyfunctional cyanate ester include 1,3- or 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4′-dicyanatobiphenyl; bis(4-cyanatophenyl)methane; 2,2-bis(4-cyanatophenyl)propane, 2,2-bis(3,5-dichloro-4-cyanatophenyl)propane, 2,2-bis(3,5dibromo-4-cyanatophenyl)propane; bis(4-cyanatophenyl)ether; bis(4-cyanatophenyl)thioether; bis(4-cyanatophenyl)sulfone; tris(4-cyanatophenyl)phosphite; tris(4-cyanatophenyl)phosphate; bis(3-chloro-4-cyanatophenyl)methane; cyanated novolak derived from novolak (U.S. Pat. Nos. 4,022,755, 3,448,079 etc.); cyanated bisphenol type polycarbonate oligomer derived from bisphenol type polycarbonate oligomer (U.S. Pat. No. 4,026,913) and mixture thereof. Other cyanate esters employed in the practice of this invention are given in U.S. Pat. Nos. 3,553,244; 3,755,402; 3,740,348, 3,595,900; 3,694,410 and 4,116,946 and British Pat. Nos. 1,305,967 and 1,060,933 which are incorporated herein by reference. Prepolymer can be prepared by polymerizing the above cyanate esters in the presence or absence of, as a catalyst, an acid such as a mineral acid or Lewis acid, a base such as sodium hydroxide, a sodium alcoholate or a tertiary amine, a salt such as sodium carbonate or lithirium chloride, or phosphate esters, such as tributyl phosphine. Use of such prepolymer is useful for adjusting the viscosity of the resin composition and the curing reaction. Prepolymers may be used containing a sym-triazine ring which is prepared by the trimerization of the cyanate groups of the cyanate ester, and which have a number average molecular weight of 300 to 6,000.

The polyfunctional cyanate ester can be used in the form of a mixture of the monomer and the prepolymer. For example, many of the commercially available cyanate esters derived from bisphenol A and cyanogen halide are in the form of mixtures of cyanate monomers and prepolymers, and such materials can also be used in the present invention. A coprepolymer of the cyanate ester and an amine may be used as the cyanate ester component. Examples of the amines include meta- or para-phenylenediamine, meta- or para-xylylenediamine, 1,4- or 1,3-cyclohexanediamine, hexahydroxylylenediamine, 4,4'-diaminobiphenyl, bis(4-aminophenyl)methane, bis(4-aminophenyl) ether, bis(4-aminophenyl)sulfone, bis(3-amino-3-methylphenyl) methane, bis(3-chloro-4-aminophenyl)methane, bis(4-amino-3,5-dimethylphenyl)methane, bis(4-aminophenyl)cyclohexane, 2,2-bis(4-aminophenyl)propane, 2,2-bis(4-amino-3-methylphenyl) propane, 2-2-bis(3,5-dibromo-4-aminophenyl)propane, bis(4-aminophenyl)phenylmethane, 3,4-diaminophenyl-4'-aminophenylmethane and 1,1-bis(4-aminophenyl)-1-phenylethane.

A mixture of prepolymer of the cyanate ester and coprepolymer of the cyanate ester and an amine may be used as mixture.

Examples of acetylacetone or its derivatives include acetylacetone, acetylacetone-ethylene diimine or acetylacetoneamine. Acetylacetone is the most preferable.

The use of such acetylacetone or its derivatives prevents decrease in conductivity of the resin coating, when heating the coating, and increase can-stability of the resin composition.

Metal chelate compounds, such as metal chelating compound of acetylacetone and metal ion, such as iron ion or zinc ion may be added to the resin composition. Iron acetylacetonate is the most preferable as a metal chelate compound. Chelating agents or organic compounds having multidenate ligand capable of being bonded to metal ion may also be added to the resin composition. Examples of the organic compounds include citric acid, ascorbic acid, tartaric acid and the like.

Methods for preparing the resin compositions comprising a cyanate ester compound, a conductive powder and acetylacetone or its derivatives are not critical. The following preparation method are possible:

(1) The conductive powder and the acetylacetone are blended, followed by adding the cyanate ester compound solution to the mixture;

(2) The conductive powder and acetylacetone are added to the cyanate ester compound solution; and (3) Solvent free cyanate ester compound, the conductive powder and acetylacetone are blended. The blending operation may be carried out by Banbury mixer, Henschel mixer, roll or the like.

A variety of additives may be added to the resin composition in order to obtain suitable viscosity of the composition or to improve adhesion, curing characteristics and flexibility of the composition. Examples of such additives include thermosetting resins, such as polyester resin, phenol resin, acrylic resin, urethane resin and the like; thermoplastic resins, such as thermoplastic urethane resin, polyvinyl acetate resin and the like; rubbers, such as polybutadiene, butadiene-acrylonitrile copolymer, polychloroprene, butadiene-styrene copolymer, polyisoprene, butyl rubber, natural rubbers and the like; natural or synthetic inorganic materials, such as silica, mica, zinc oxide, titanium oxide and the like; organic solvents, such acetone, methyl ethyl ketone N,N-dimethyl formamide, butylcarbitol acetate and the like; organic acids; inorganic acids; coupling agents; flame retardants; self-extinguishing agents and well known additives.

The curable composition of this invention may be reticulated by heating it alone to form a cured resin having heat resistance. In general, a catalyst may be used in order to promote crosslinking reaction of the components in the composition.

Examples of the catalysts include imidazoles, such as 2-methylimidazole, 2-undecylimidazole, 2-heptadecylimidazole, 2-phenylimidazole, 2-ethyl-4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition product of an imidazole and trimellitic acid; tertiary amines, such as N,N-dimethyl benzylamine, N,N-dimethylaniline, N,N-dimethyltoluidine, N,N-dimethyl-p-anisidine, p-halogene-N,N-dimethylaniline, 2-N-ethylanilino ethanol, tri-n-butylamine, pyridine, quinoline, N-methylvorpholine, triethanolamine, triethylenediamine, N,N,N',N'-tetramethylbutanediamine, N-methylpiperidine; phenols, such as phenol, cresol, xylenol, resorcine, and phloroglusin; organic metal salts, such as lead naphthanate, lead stearate, zinc naphthanate, zinc octoate, tin oleate, dibutyl tin maleate, manganese naphthenate, cobalt naphthenate, and acetyl acetone iron; and inorganic metal salts, such as stannic chloride, zinc chloride and aluminum chloride; peroxides, such as benzoyl peroxide, lauroyl peroxide, octanoyl peroxide, acetyl peroxide, para-chlorobenzoyl peroxide and di-t-butyl diperphthalate; acid anhydrides, such as maleic anhydride, phthalic anhydride, lauric anhydride, pyromellitic anhydride, trimellitic anhydride, hexahydrophthalic anhydride, hexahydropyromellitic anhydride and hexahydrotrimellitic anhydride; azo compounds, such as azoisobutylonitrile, 2-2'-azobispropane, m,m'-azoxystyrene, hydrozones, and mixtures thereof.

The amount of the catalyst employed may be less than 10% by weight of the total composition.

The temperature for curing the resin composition of this invention depends on proportion of each component in the composition, particulars of metal powder and cyanate ester compounds and presence or absence of curing agent and catalysts. In general, the temperature may be in the range of 100°–300° C.

The present invention is further illustrated by the following non-limiting Examples and Comparative runs.

All percentages and parts in these Examples and Comparative runs are by weight, unless otherwise specified.

EXAMPLE 1

150 Grams of 2,2-bis(4-cyanatophenyl)propane was prepolymerized at 150° C. for 180 minutes. The resulting prepolymer was dissolved in 850 g of methyl ethyl ketone. To the mixture were added 10 g of acetylacetone and 400 g of silver powder (average particle size=$3\mu$).

reacted at 160° C. for 2 hours. To the resulting co-prepolymer was mixed 20 g of epoxy resin represented by the formula

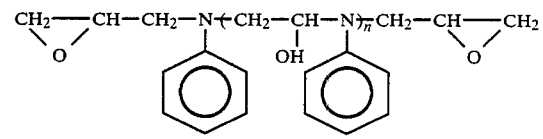

(wherein n is 3.2). The reaction was carried out at 140° C. for 2 hours to obtain liquid resin composition having viscosity of 5.6 poise at 25° C. The resulting composition is referred to as Resin B.

The components as shown in Table 2 were blended. Printing patterns were prepared in the same way as Example 1. The results are shown in Table 2.

TABLE 1

|  | Control Test 2 | Example 2 | Example 3 | Example 4 | Example 5 | Control test 3 | Control test 4 |
|---|---|---|---|---|---|---|---|
| Resin A | 15.8 | 15.8 | 15.8 | 15.8 | 15.8 | 15.8 | 15.8 |
| Copper powder | 84.2 | 84.2 | 84.2 | 84.2 | 84.2 | 84.2 | 84.2 |
| Acetylacetone | 0 | 0.53 | 2.63 | 5.26 | 10.5 | 0 | 0 |
| Anthranilic acid | 0 | 0 | 0 | 0 | 0 | 0.53 | 10.5 |
| Curing conditions | Electric resistance ($\Omega$ cm) | | | | | | |
| at 90° C. for 30 min. | $4 \times 10^{-2}$ | $0.9 \times 10^{-2}$ | $0.9 \times 10^{-2}$ | $0.5 \times 10^{-2}$ | $0.6 \times 10^{-2}$ | more than 10 | more than 10 |
| at 90° C. for 30 min. and at 140° C. for additional 120 min. | $10 \times 10^{-2}$ | $1.0 \times 10^{-2}$ | $1.0 \times 10^{-2}$ | $0.6 \times 10^{-2}$ | $0.6 \times 10^{-2}$ | " | " |
| at 90° C. for 30 min. and at 150° C. for additional 240 min. | more than 10 | $4.0 \times 10^{-2}$ | $3.0 \times 10^{-2}$ | $0.8 \times 10^{-2}$ | $0.7 \times 10^{-2}$ | " | " |
| at 90° C. for 30 min. and at 170° C. for additional 60 min. | " | $4.0 \times 10^{-2}$ | $3.0 \times 10^{-2}$ | $2.0 \times 10^{-2}$ | $1.0 \times 10^{-2}$ | " | " |

The resulting resin composition was printed on epoxy resin laminate plate in pattern 2 mm wide and 20 cm long by using screen with 250 mesh and $100\mu$ thickness. The resin composition was heat-cured at 79° C. for 60 minutes and 180° C. for additional 90 minutes.

The resulting pattern had electric resistance of $0.9 \times 10^{-4} \times \Omega$cm. When the above resin composition was stored at 40° C. for 30 days, it was not gelled. This means that the resin composition has excellent can-stability.

CONTROL TEST 1

The procedure of Example 1 was repeated except that acetylacetone was not used. The result pattern had electric resistance of $1 \times 10^{-4}$ $\Omega$cm. When the resin composition was stored at 40° C. for 30 days, it was gelled.

EXAMPLES 2–5 AND CONTROL TESTS 2–4

80 Grams of 1,4-dicyanatobenzene was reacted with 20 g of bis(4-maleimidophenyl)sulfone at 160° C. for 60 minutes preliminarily. The resulting resin is referred to as Resin A.

Resin A, copper powder (average particle size=$13\mu$) and acetylacetone, anthranilic acid and mixed solvent (methyl ethyl ketone/N,N-dimethylformamide=3/1) were mixed as given in Table 1. The compositions were printed on ceramic plate in pattern (10 mm wide, $40\mu$ thick and 10 cm long). The patterns were heated under conditions as given in Table 1. The results are shown in Table 1.

EXAMPLE 6 AND CONTROL TEST 5

90 Grams of 2,2-bis(4-cyanatophenyl)propane and 10 g of bis(4-maleimidephenyl)methane were preliminarily

TABLE 2

|  | Control test 5 | Example 6 |
|---|---|---|
| Resin B | 15.8 | 15.8 |
| Copper powder | 84.2 | 84.2 |
| Acetylacetone | 0 | 2.63 |
| Benzoyl peroxide | 0.5 | 0.5 |
| Iron acetylacetone | 0.01 | 0.01 |
| Curing conditions | Electric resistance ($\Omega$ cm) | |
| at 90° C. for 30 min. | more than 10 | $0.4 \times 10^{-2}$ |
| at 90° C. for 30 min. and at 140° C. for additional 120 min. | " | $0.9 \times 10^{-2}$ |
| at 90° C. for 30 min. and at 150° C. for additional 240 min. | " | $0.06 \times 10^{-2}$ |
| at 90° C. for 30 min. and at 170° C. for additional 60 min. | " | $0.07 \times 10^{-2}$ |

EXAMPLE 7

120 Parts of 2,2-bis(4-cyanatophenyl)propane and 30 parts of bis(4-maleimidophenyl)methane were preliminarily reacted at 160° C. for 2 hours. To the resulting prepolymer were added 30 parts of bisphenol A type epoxy resin (Epikote 828 sold by Shell Oil Co., Ltd.), 0.5 parts of benzoyl peroxide, 0.01 parts of iron acetylacetonate, 25 parts of acetylacetone, 10 parts of zinc chloride and 525 parts of copper powder. A solvent was added to the mixture to adjust its viscosity with stirring. The composition were printed on ceramic plate in pattern (10 mm wide, $40\mu$ thick and 10 cm long). The initial electrical conductivity of the pattern was $4 \times 10^{-4}$ $\Omega$cm. When the pattern was allowed to stand at 40° C. at relative humidity of 40% for 30 hours, the electrical conductivity thereof amounted to 90% of the initial value. Even when the pattern was allowed to stand under the same conditions for 300 hours, the conductivity did not change.

What is claimed is:

1. An electrically conductive resin composition comprising
15–35 parts by weight of a cyanate ester compound which is a monomer, polymer thereof or mixture of monomer and polymer, wherein said monomer has the formula

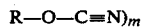

wherein m is an integer of 2–10 and R is an aromatic organic group, the cyanate groups being bonded to said aromatic organic group, and
65–85 parts by weight of an electrically conductive powder selected from the group consisting of a copper powder, a copper alloy powder, and a silver powder and mixtures thereof,
the cyanate ester component content in the cyanate ester compound being more than 50% by weight in terms of monomer, and
said composition further containing 0.5–15 parts by weight of at least one acetylacetone compound selected from the group consisting of acetylacetone, acetylacetone-ethylene diamine and acetylacetoneamine.

2. The composition of claim 1 wherein it further contains a metal chelate compound of the acetylacetone compound and a metal ion.

3. The process of claim 1 wherein the cyanate ester compound is 2,2-bis(4-cyanatophenyl)propane.

4. The process of claim 1 wherein acetylacetone is used.

5. The process of claim 1 wherein the conductive powder is copper powder.

6. The process of claim 1 wherein the cyanate ester compound is cyanate ester-maleimide resin composition.

7. The process of claim 1 wherein the cyanate ester compound is cyanate ester-maleimide-epoxy resin composition.

8. The process of claim 1 wherein the cyanate ester compound is cyanate ester-epoxy resin composition.

* * * * *